June 13, 1967 D. A. MRAZEK 3,325,654
FET SWITCHING UTILIZING MATCHING EQUIVALENT CAPACITIVE MEANS
Filed Oct. 9, 1964
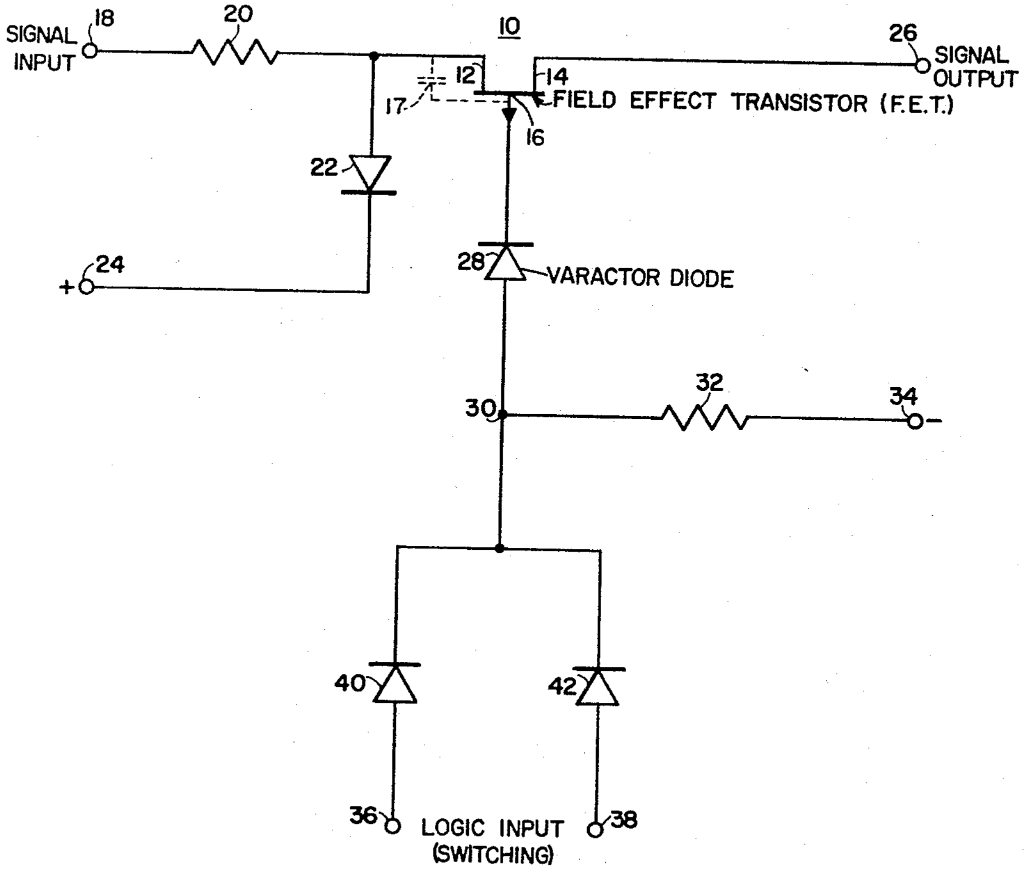
INVENTOR.
DALE A. MRAZEK
BY
ATTORNEY United States Patent Office 3,325,654
Patented June 13, 1967

3,325,654
FET SWITCHING UTILIZING MATCHING EQUIVALENT CAPACITIVE MEANS

Dale A. Mrazek, Minneapolis, Minn., assignor to Honeywell Inc., Minneapolis, Minn., a corporation of Delaware Filed Oct. 9, 1964, Ser. No. 402,883
10 Claims. (Cl. 307—88.5)

ABSTRACT OF THE DISCLOSURE

This specification describes a field-effect transistor switch in which switching signals are applied to the control gate through a varactor diode that has an equivalent capacitance matched to the equivalent switching capacitance of the transistor.

This invention generally pertains to control apparatus. More specifically it pertains to electronic switching circuitry. Even more specifically this invention pertains to switching circuitry with a plurality of switching inputs using a transistor as the switching device.

The inventive concept generally pertains to a method of and the circuitry for increasing the switching speed of an analogue switch. It is well-known to those skilled in the art that faster switching speeds are highly desirable. In many applications the switching speed of electronic switches is a limiting factor in overall system operation. One of the most limiting factors in switching speed is the stored charge in a P-N junction device. The stored charge in the P-N junction must leak off or be neutralized before the switching operation can be completed. An equivalent capacitance for this stored charge in a P-N junction can be mathematically developed as is shown in A. van der Ziel, Solid State Physical Electronics, Prentice-Hall, Inc., Englewood Cliffs, N.J., 1957, pp. 282–97. It is well-known that field-effect transistors are faster operating than standard junction transistors because they are majority carrier devices (van de Ziel, pp. 332–4). These devices still have an equivalent capacitance that causes the switching speed to be less than desired. This invention, however, diminishes the effect of the stored charge in the field-effect transistor P-N junctions by using a varactor diode in the switching input. The varactor diode is P-N junction device with a relatively large junction capacitance designed into it. The effect of the equivalent capacitance of the one or more P-N junctions of the field-effect transistor is thereby diminished because the charge can flow between the varactor diode P-N junction and the field-effect transistor's junctions. The effect of the stored charge can be minimized by matching the equivalent capacitance between the source and gate of the field-effect transistor to the equivalent capacitance of the varactor diode. If the equivalent capacitances are matched, the amount of charge, other than the charge flowing between the P-N junction of the diode and the P-N junctions of the field-effect transistor, that must be neutralized is at a minimum and the switching speed is at a maximum. Also the amount of energy absorbed by the field-effect transistor switch is at a minimum.

It is an object of this invention, therefore, to provide an improved switch employing a field-effect transistor.

It is another object of this invention to provide an improved switch with faster switching speeds by using a varactor diode in an analogue switch.

It is a more specific object of this invention to provide an improved analogue switch by matching the equivalent capacitance of a field-effect transistor and a varactor diode thereby minimizing the effect of the stored charge in the semiconductors.

These and other objects of this invention will become apparent to those skilled in the art upon a reading of this specification and the appended claims in conjunction with the drawing of which the single figure is a schematic representation of one embodiment of this invention.

Referring now to the drawing there is shown a control device, switching device, or transistor means generally designated as 10. In the specific embodiment illustrated transistor 10 is a field-effect transistor (FET) with a channel of P-type conductivity. The FET has an input or source 12, an output or drain 14, and a control or gate 16. A capacitor 17 is shown in dashed lines as if connected between source 12 and gate 16. Capacitor 17 represents the equivalent capacitance of FET 10. It is not an actual circuit element but is rather illustrative of the inherent capacitive effect of the P-N junctions in FET 10. The P-N junctions which give rise to this equivalent capacitance are the junctions between the gate or gates and the source, drain, and channel regions of FET 10. The source 12 is connected to an input terminal 18 by means of an impedance or resistor 20 and is further connected to the anode of a current control device or diode 22. The cathode of diode 22 is connected to a source of positive potential 24. As defined in this specification, the direction of easy current flow is from anode to cathode. The drain 14 of the FET 10 is connected to an output terminal 26. The gate 16 of the FET 10 is connected to a cathode of a unidirectional conducting means, diode means, or varactor diode 28 which has an anode connected to a junction point 30. While a varactor diode is used in the specific embodiment any other control device with a voltage of current controlled capacitance characteristic similar to that of a varactor diode can be used. The junction point 30 is connected through an impedance means or resistor 32 to a source of negative potential 34. The junction point 30 is further connected to a plurality of logic, control, or switching input terminals 36 and 38, respectively, by a plurality of unidirectional current controlled devices or diodes 40 and 42. The diodes 40 and 42 are polarized to permit current flow from the logic inputs 36 and 38 to the junction point 30 but they block current flow in the reverse direction and from one logic input to any other logic input. For simplicity only the two logic inputs 36 and 38 are shown. Diodes 40 and 42 connect the logic inputs 36 and 38, respectively, to junction point 30.

In understanding the operation of the preferred embodiment, it may be assumed that no input signal is applied at either of the logic inputs 36 or 38 and that the potential source 34 holds junction point 30 at a negative potential. Because this negative potential reverse biases the varactor diode 28, there will be only small leakage currents flowing through the resistor 32 and junction point 30 will be at substantially the same negative potential as source 34. The FET 10 will be biased in a low impedance or ON condition and will act as a small resistance between the input 18 and the output 26.

When an input logic, control, or switching signal is applied to either logic input 36 or 38 or both logic inputs simultaneously, the potential of junction point 30 will rise to a positive potential approximately equal to the voltage level of the logic input signals. If a signal is applied to logic input 36, for example, the diode 40 will be forward biased and the diode 42 will be reverse biased. Current will flow from logic input 36 through diode 40 and resistor 32 to source 34. The potential rise of junction point 30 will cause the varactor diode 28 to become forward biased, thus raising the potential of the gate 16 of FET 10. When the potential of the gate 16 is raised, the P-N junctions between the gate 16 and the channel of the FET 10 are reverse biased thereby widening the charge depletion layers of the P-N junctions and increasing the resistance between the source 12 and the drain 14. If the potential rise of the gate 16 is large enough, the charge depletion layers will extend completely across the channel. When this occurs the FET 10 is in a "pinchoff" condition and maintains an extremely high resistance between the source 12 and drain 14. Thus, the signal at the input 18 "sees" an open circuit and no signal is transmitted to the output 26. The diode 22 and the source 24 limit the positive swing of the input signal applied to terminal 18 and protect the FET 10 from damage.

When the FET 10 is switched from the "pinchoff" or OFF condition to the ON condition, the charge stored in the depletion layers must be neutralized to increase the switching speed. Also, when the FET 10 is switched from ON to OFF the charge carriers must be swept out of the channel before the depletion layers can expand to "pinchoff." This operation is much the same as the charging and discharging of a capacitor. By chosing a varactor diode 28 with an equivalent capacitance matched to the FET 10, this transfer of charge is enhanced or speeded up, thereby increasing the switching speed of the circuit.

As mentioned previously, the number of logic inputs is completely arbitrary and can be one or as many as desired. Only two logic inputs are shown for simplicity of explanation. Also, the varactor diode 28 can be replaced by any unilateral current control device that has an equivalent capacitance that matches the FET equivalent capacitance. These and other modifications will be apparent to those skilled in the art. Therefore, the applicant does not intended to be limited by the specific embodiment shown and described but only by the scope of the appended claims. I claim as my invention:

1. An electronic analogue switching circuit comprising, in combination:
   analogue input signal means;
   field-effect transistor means having a source means, a drain means, and a gate means, having a channel of p-type conductivity and further having an equivalent capacitance between said source means and said gate means, and said drain means comprising an output signal means;
   means connecting said analogue input signal means to said source means;
   voltage limiting means connected to said source means for limiting the amplitude of the analogue input signal;
   varactor diode means having an equivalent capacitance that matches said equivalent capacitance between said source means and said gate means of said field-effect transistor means, said varactor diode means further having an anode means and a cathode means;
   means connecting said cathode means to said gate means;
   negative potential supplying means;
   resistive means connecting said negative potential supplying means to said anode means;
   a plurality of logic input signal means; and
   a plurality of diode means, each of said diode means connecting one of said logic input signal means to said anode means of said varactor diode means, and all of said plurality of diode means being polarized to permit current flow from said logic input means to said cathode means.

2. A switching circuit comprising, in combination:
   field-effect transistor means having input means, output means and control means, and further having an equivalent capacitance between said input means and said control means;
   means connecting said input means to receive an analogue input signal;
   limiting means connected to said input means of said field-effect transistor means for limiting the amplitude of said analogue input signal;
   varactor diode means connected to said control means of said field-effect transistor means, said varactor diode means having an equivalent capacitance substantially equal to said equivalent capacitance between said input means and control means of said field-effect transistor means;
   logic switching means for receiving an input switching signal;
   means connecting said logic switching means to said varactor diode means; and
   means connected to said varactor diode means operable to hold said varactor diode means reverse biased in the absence of said input switching signal.

3. Switching apparatus of the class described comprising, in combination:
   logic input means for receiving switching signals;
   means for providing an input signal;
   transistor means having an input means, an output means, and a control means and further having a high impedance state and a low impedance state, said input means being connected to receive said input signal to be switched by said transistor means, said control means being connected to receive said switching signals, said transistor means being in said low impedance state in the absence of said switching signals and in said high impedance state in the presence of said switching signals, and said output means providing an output signal which is representative of said input signal when said transistor means is in said low impedance state;
   varactor diode means connected between said logic input means and said control means of said transistor means, said varactor diode means having an equivalent capacitance that matches the equivalent switching capacitance of said transistor means; and
   means connected to said varactor diode means for reverse biasing said varactor diode means in the absence of said switching signals.

4. Switching apparatus of the class described comprising, in combination:
   first input means for receiving switching signals;
   second input means for providing an input signal;
   field-effect transistor means having an input means, an output means, and a control means and further having a high impedance state and a low impedance state, said field-effect transistor means being in said low impedance state in the absence of said switching signals and in said high impedance state in the presence of said switching signals;
   means connecting said input means of said field-effect transistor means to said second input means;
   varactor diode means, said varactor diode means being reverse biased in the absence of said switching signals; and
   means connecting said varactor diode means between said first input means and said control means.

5. Apparatus of the class described comprising, in combination:
   switching input means for supplying switching signals;
   field-effect transistor means having an input means, an output means, and a control means, said input means operable to receive an input signal, said field-effect transistor means normally being in a conducting state thereby allowing passage of said input signal to said output means, said control means connected to receive said switching signals, said switching signals operable to switch said field-effect transistor means to a high impedance state thereby blocking said input signals, and said field-effect transistor further having a stored charge in said high impedance state;
   unilateral conducting means having a forward biased and a reverse biased condition, and normally being in said reverse biased condition, said unilateral conducting means further having a stored charge in said reverse biased condition;
   means connecting said unilateral conducting means between said switching input means and said control means of said field-effect transistor means whereby said switching signals are operable to forward bias said unilateral conducting means, and said stored charge in said unilateral conducting means in said reverse biased condition being substantially equal to said stored charge in said field-effect transitsor means in said high impedance state.

6. Apparatus of the class described comprising, in combination:

field-effect transistor means having input, output, and control means, said field-effect transistor means normally being in a first conductivity state;

varactor diode means connected to said control means;

control signal input means for providing control signals; and means connecting said control signal input means to said varactor diode means whereby said control signals are operable to switch said field-effect transistor means to a second conductivity state.

7. Apparatus of the class described comprising, in combination:

field-effect transitsor means having input, output, and control means, said field-effect transistor means normally being in a first conducting state;

diode means connected to said control means;

and control signal input means connected to said diode means, the control signal applied to said control signal input means being operable to switch said field-effect transistor means to a second conducting state, and said diode means and said field-effect transistor means having substantially equal equivalent capacitances to enhance the switching operation.

8. In switching apparatus:

field-effect transistor means having input, output, and control means, said field-effect transistor means normally being in a first conducting state;

switching input means operable to receive switching signals; and voltage controlled capacitive means connected between said switching input means and said control means whereby said switching signals are operable to switch said field-effect transistor means to a second conducting state, said voltage controlled capacitive means having a capacitance substantially equal to the equivalent capacitance of said field-effect transistor means.

9. Switching apparatus of the class described comprising, in combination:

field-effect transistor means having an equivalent capacitance;

voltage controlled semiconductor means having an equivalent capacitance substantially equal to the equivalent capacitance of said field-effect transistor means;

a source of switching signals; and means connecting said voltage controlled semiconductor means between said source of switching signals and said field-effect transistor means.

10. Apparatus of the class described comprising, in combination:

semiconductor switching means having an equivalent capacitance;

voltage controlled capacitive means connected to said semiconductor switching means, said voltage controlled capacitive means having a capacitance substantially equal to said equivalent capacitance of said semiconductor switching means; and a source of switching signals connected to said voltage controlled capacitive means.

References Cited

UNITED STATES PATENTS

| | | | |
|---|---|---|---|
| 3,129,354 | 4/1964 | Hellstrom | 307—88.5 |
| 3,215,859 | 11/1965 | Sorchych | 307—88.5 |
| 3,260,863 | 7/1966 | Burns et al. | 307—88.5 |

ARTHUR GAUSS, *Primary Examiner.*

B. P. DAVIS, *Assistant Examiner.*